(12) United States Patent
Chang et al.

(10) Patent No.: US 8,326,173 B2
(45) Date of Patent: Dec. 4, 2012

(54) HARD IMAGING DEVICES, HUMIDITY CONTROL SYSTEMS AND HARD IMAGING METHODS

(75) Inventors: Seongsik Chang, Santa Clara, CA (US);
Viet Hung Phan, Milpitas, CA (US);
Michael H. Lee, San Jose, CA (US);
Omer Gila, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 573 days.

(21) Appl. No.: 12/562,467

(22) Filed: Sep. 18, 2009

(65) Prior Publication Data

US 2011/0069987 A1    Mar. 24, 2011

(51) Int. Cl.
*G03G 21/00* (2006.01)
(52) U.S. Cl. .......................................... 399/97; 399/98
(58) Field of Classification Search .................. 399/97, 399/98
See application file for complete search history.

(56) References Cited

U.S. PATENT DOCUMENTS

| | | | | |
|---|---|---|---|---|
| 3,634,007 A | * | 1/1972 | Verderber et al. | 399/96 |
| 3,677,632 A | * | 7/1972 | MacDonald, Jr. | 399/94 |
| 4,161,357 A | * | 7/1979 | Herman et al. | 219/201 |
| 4,727,385 A | * | 2/1988 | Nishikawa et al. | 347/152 |
| 5,469,242 A | * | 11/1995 | Yu et al. | 399/172 |
| 5,539,500 A | * | 7/1996 | Hamamichi et al. | 399/97 |
| 5,862,439 A | * | 1/1999 | Pozzanghera | 399/98 |
| 6,397,024 B1 | * | 5/2002 | Rejewski et al. | 399/92 |
| 6,931,223 B2 | * | 8/2005 | Yamada | 399/97 |
| 7,035,567 B2 | | 4/2006 | Gila et al. | |
| 7,050,742 B2 | * | 5/2006 | Gila et al. | 399/168 |
| 2003/0044195 A1 | * | 3/2003 | Amering et al. | 399/100 |
| 2005/0095035 A1 | | 5/2005 | Vejtasa et al. | |
| 2005/0201785 A1 | | 9/2005 | Gila et al. | |
| 2006/0024081 A1 | | 2/2006 | Gila et al. | |
| 2006/0024082 A1 | | 2/2006 | Gila et al. | |
| 2009/0033735 A1 | | 2/2009 | Leoni et al. | |

OTHER PUBLICATIONS

"New Technologies for High Durable/Reliable Photoconductor Unit in Color MFP"; Kasai et al.; NIP23 and Digital Fabrication; 2007; pp. 18-21.

* cited by examiner

*Primary Examiner* — David Gray
*Assistant Examiner* — Geoffrey Evans

(57) ABSTRACT

Hard imaging devices, humidity control systems and hard imaging methods are described. According to one arrangement, a hard imaging device includes an imaging member comprising a surface and a writing assembly configured to form latent images upon the surface of the imaging member. The hard imaging device also includes a development assembly configured to provide a marking agent to the surface of the imaging member to develop the latent images to form developed images, a transfer assembly configured to transfer the developed images from the surface of the imaging member to media to form a plurality of hard images, and a humidity control system configured to control humidity within a region of the hard imaging device which is adjacent to the surface of the imaging member during the forming and the development of the latent images. Other structure and methods are described.

15 Claims, 5 Drawing Sheets

HARD IMAGING DEVICES, HUMIDITY CONTROL SYSTEMS AND HARD IMAGING METHODS

BACKGROUND

Imaging devices capable of printing images upon paper and other media are ubiquitous and used in many applications including monochrome and color applications. For example, laser printers, ink jet printers, and digital printing presses are but a few examples of imaging devices in wide use today for monochrome or color imaging.

Electrophotographic imaging processes utilize a photoconductor which may be electrically charged and then selectively discharged to form latent images. The latent images may be developed and the developed images are transferred to media to form hard images upon the media. Electrophotographic imaging processes may be implemented in laser printer configurations and digital presses in illustrative examples.

One drawback with some electrophotographic systems is the photoconductor may be subjected to contamination resulting from the printing process. More specifically, during printing, a layer of contamination material resulting from the printing process may form upon the photoconductor. If not removed, a relatively thin layer of contamination material (tens of nanometers) may adversely affect print quality. The layer of contamination material may increase lateral conductivity which may, for example, erase dots of the latent images. In some arrangements, the photoconductor may be a consumable which is replaced after a number of impressions have been imaged. More frequent replacement raises the cost of printing.

At least some aspects of the present disclosure are directed towards improved hard imaging devices and imaging methods.

DETAILED DESCRIPTION

Hard imaging devices, humidity control systems and hard imaging methods are described according to some embodiments of the disclosure. Some embodiments are directed towards electrophotographic imaging methods and hard imaging devices which implement electrophotographic imaging processes to form hard images. During formation of hard images, a photoconductive imaging member of an electrophotographic imaging system may be contaminated with contamination material which may increase lateral conductivity upon a surface of the photoconductive imaging member and which may degrade print quality. At least some embodiments of the disclosure provide apparatus and methods for controlling humidity within at least one region of the hard imaging device during imaging. In one example embodiment described below, the humidity within at least one region of a hard imaging device may be maintained within a desired range to provide reduced lateral conductivity upon the surface of the imaging member during imaging operations and with contamination material upon the surface of the imaging member. Other embodiments and aspects of the disclosure are described in detail below.

Figure 1:
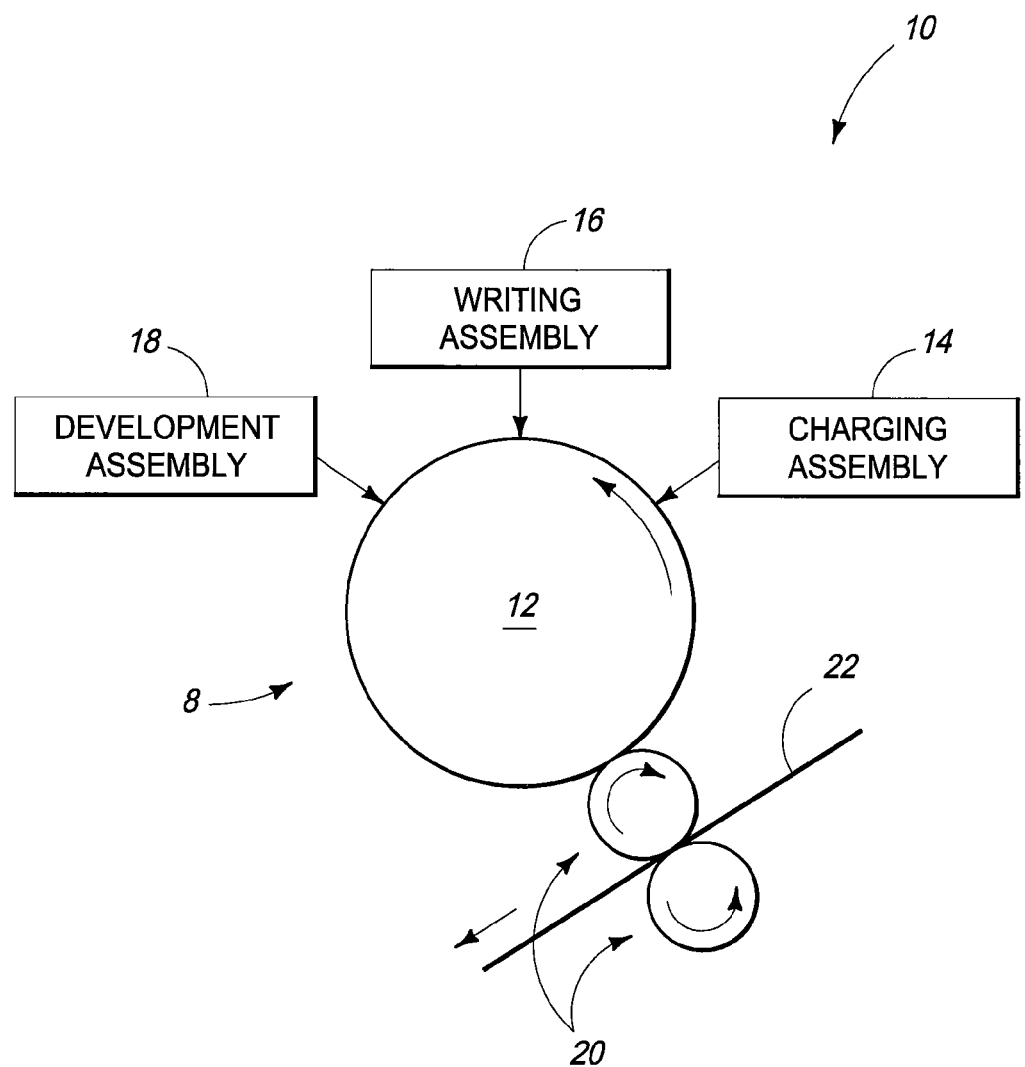
FIG. 1 is an illustrative representation of a hard imaging device according to one embodiment.

Referring to FIG. 1, an example of an image engine 8 of a hard image device 10 is shown according to one illustrative embodiment. The depicted arrangement of the hard imaging device 10 is configured to implement electrophotographic imaging operations wherein latent images are formed and developed by the image engine 8 to form developed images which are subsequently transferred to media 22 to form hard images. Examples of hard imaging devices 10 include laser printers, digital presses (e.g., Indigo® presses available from the Hewlett-Packard Company) or other arrangements configured to form hard images upon media 22.

The image engine 8 of hard imaging device 10 depicted in FIG. 1 includes an imaging member 12, a charging assembly 14, a writing assembly 16, a development assembly 18, and a transfer assembly 20. Hard imaging device 10 is configured to form hard images upon media 22, such as paper or other suitable imaging substrates. Other hard imaging devices 10 may include more, less or alternative components or other arrangements in other embodiments.

In one operational embodiment, charging assembly 14 is configured to deposit a blanket electrical charge upon substantially an entirety of an outer surface of imaging member 12 which may be implemented as a photoconductor, such as a photo-imaging plate, photoconductive belt, photoconductive drum or other arrangement. In one embodiment, the outer surface of the photoconductor comprises an organic photoconductor surface including polycarbonate and electrically conductive charge transport materials.

Writing assembly 16 is configured as a laser or LED in one embodiment to discharge selected portions of the outer surface of the imaging member 12 to form latent images.

Development assembly 18 is configured to provide a marking agent to the outer surface of imaging member 12 to develop the latent images formed thereon. Different marking agents may be used in different embodiments. In one embodiment, a dry marking agent (e.g., toner) may be used to develop the latent images. In another embodiment, a liquid marking agent which includes ink particles suspended in a liquid carrier fluid, such as oil, may be used (e.g., Electroink® available from the Hewlett-Packard Company). Other marking agents may be used in other embodiments.

During development, the marking agent is received by the discharged portions of the outer surface of the imaging member 12 (corresponding to the latent images) to develop the latent images and form developed images upon the outer surface of imaging member 12 in one embodiment. The developed images are transferred by transfer assembly 20 from the outer surface of the imaging member 12 to media 22 in one embodiment.

Figure 2:
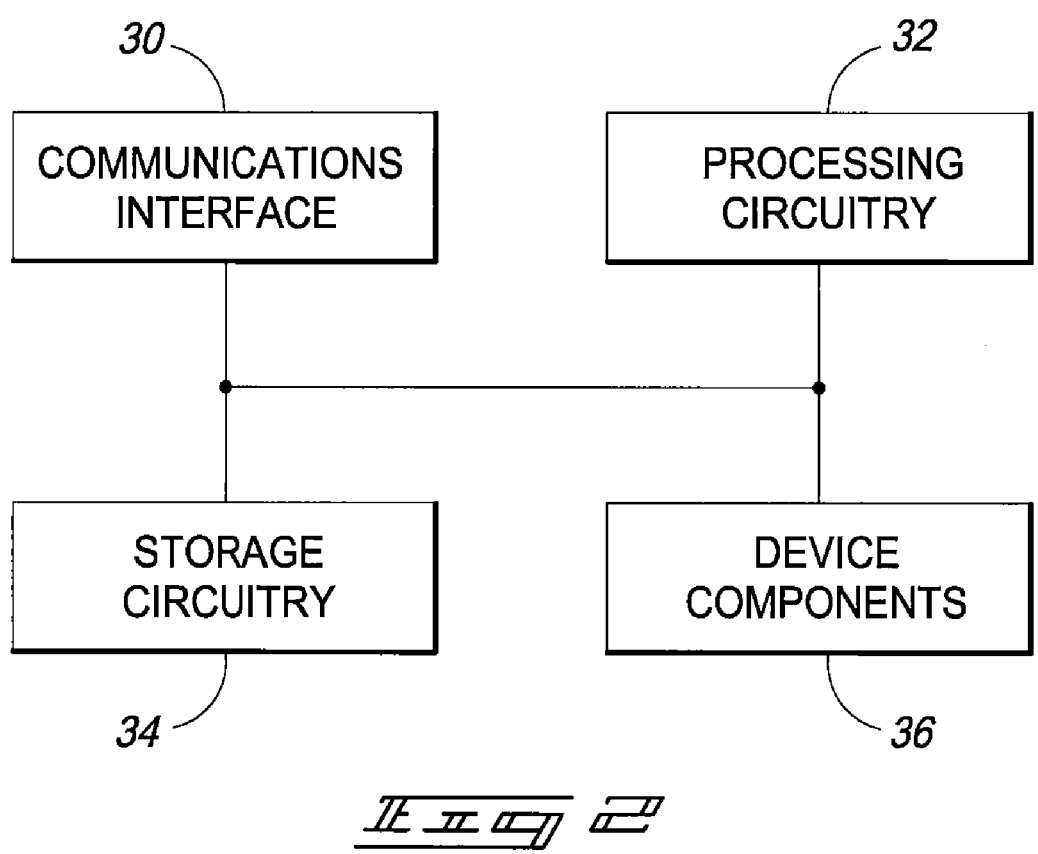
FIG. 2 is a functional block diagram of circuit components of a hard imaging device according to one embodiment.

Referring to FIG. 2, an example of circuit components of hard imaging device 10 is illustrated according to one embodiment. The circuit components include a communications interface 30, processing circuitry 32, storage circuitry 34 and device components 36 in one embodiment of hard imaging device 10. More, less or alternative components are provided in other embodiments of hard imaging device 10.

Communications interface 30 is arranged to implement communications of hard imaging device 10 with respect to external devices (not shown). For example, communications interface 30 may be arranged to communicate information bi-directionally with respect to device 10. Communications interface 12 may be implemented as a network interface card (NIC), serial or parallel connection, USB port, Firewire interface, flash memory interface, floppy disk drive, or any other suitable arrangement for communicating with respect to device 10. In one example, image data of hard images to be formed may be received by communications interface 30 from an external network or external source (e.g., computer).

In one embodiment, processing circuitry 32 is arranged to process data, control data access and storage, issue commands, and control imaging operations of device 10. Processing circuitry 32 is configured to control imaging operations of device 10, such as the formation and development of latent images upon imaging member 12 in one embodiment. Processing circuitry 32 may also monitor the humidity in one or more region of device 10 and may control operations discussed herein to maintain levels of humidity within desired ranges in one embodiment.

Processing circuitry 32 may comprise circuitry configured to implement desired programming provided by appropriate media in at least one embodiment. For example, the processing circuitry 32 may be implemented as one or more of a processor and/or other structure configured to execute executable instructions including, for example, software and/or firmware instructions, and/or hardware circuitry. Exemplary embodiments of processing circuitry 32 include hardware logic, PGA, FPGA, ASIC, state machines, and/or other structures alone or in combination with a processor. These examples of processing circuitry 32 are for illustration and other configurations are possible.

The storage circuitry 34 is configured to store programming such as executable code or instructions (e.g., software and/or firmware), electronic data, databases, image data, or other digital information and may include processor-usable media. Processor-usable media may be embodied in any computer program product(s) or article of manufacture(s) which can contain, store, or maintain programming, data and/or digital information for use by or in connection with an instruction execution system including processing circuitry in the exemplary embodiment. For example, exemplary processor-usable media may include any one of physical media such as electronic, magnetic, optical, electromagnetic, infrared or semiconductor media. Some more specific examples of processor-usable media include, but are not limited to, a portable magnetic computer diskette, such as a floppy diskette, zip disk, hard drive, random access memory, read only memory, flash memory, cache memory, and/or other configurations capable of storing programming, data, or other digital information.

At least some embodiments or aspects described herein may be implemented using programming stored within appropriate storage circuitry 34 described above and configured to control appropriate processing circuitry 32. For example, programming may be provided via appropriate articles of manufacture including, for example, embodied within media discussed above.

Device components 36 include additional electrical components of the hard imaging device 10. For example, device components 36 may include sensors, pumps, motors, a user interface, variable valves, and other additional electrical or electro-mechanical components which may be controlled or monitored by processing circuitry 32.

Figure 3:
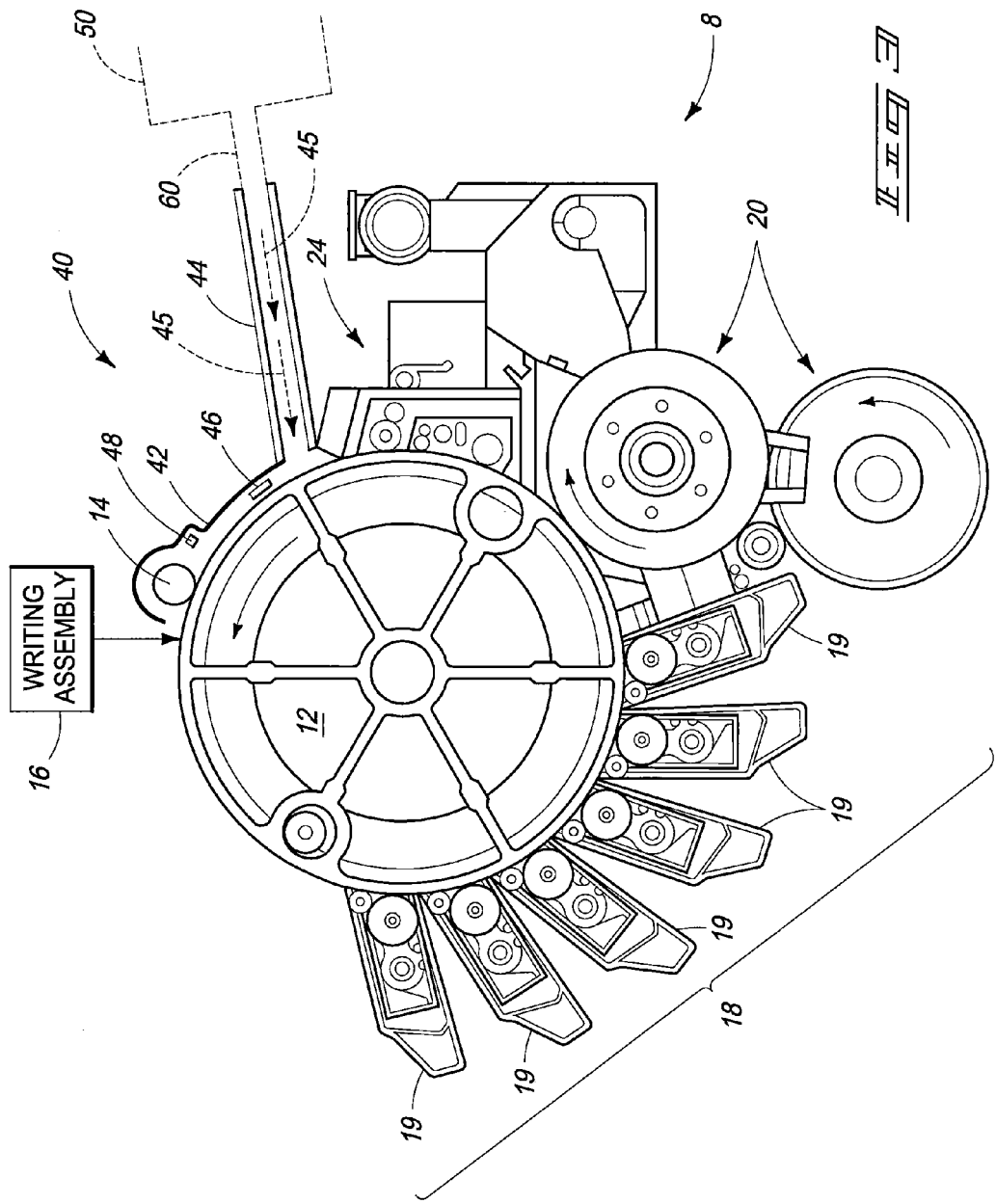
FIG. 3 is an illustrative representation of an image engine according to one embodiment.

Referring to FIG. 3, additional details of image engine 8 of hard imaging device 10 are shown according to one embodiment. In the depicted example, the outer surface of the imaging member 12 is configured to rotate adjacent to charging assembly 14 implemented as a charging roller 14 in the illustrated embodiment. Thereafter, the outer surface rotates adjacent to writing assembly 16 which is configured to form the latent images upon the outer surface of imaging member 12. Development assembly 18 includes six development devices 19 configured to provide marking agent (e.g., for a plurality of colors) to the outer surface to develop the latent images in the depicted example embodiment. Transfer assembly 20 is configured to transfer the developed images to media (not shown in FIG. 3). Thereafter, a cleaning system 24 is configured to remove remaining marking agent from the outer surface of imaging member 12.

As discussed above, contamination material may form (e.g., in a layer) upon the outer surface of the imaging member 12 as a result of imaging operations to form hard images. The contamination material may include material from the marking agents in one example (e.g., polymerized material from the carrier fluid of a liquid marking agent). The contamination may become sufficient where replacement or cleaning of the imaging member 12 may be implemented to provide printing with acceptable print quality. More specifically, the layer of contamination material upon the surface of the imaging member 12 may increase over time during imaging and may result in the surface of imaging member 12 having increased lateral conductivity which reduces the ability of the image engine 8 to form latent images of small dots on the surface and/or transfer small dots from the surface to media 22 and which may result in printed sections appearing lighter in color compared with arrangements which are not contaminated. As the contamination of the imaging member increases over time, the print quality of subsequently formed images is reduced.

The presence of relatively humid air with the contamination material may increase the lateral conductivity of the surface of the imaging member 12. For example, the humidity may be absorbed into the layer of contamination material which increases the lateral conductivity and which may shorten the lifespan of the imaging member 12 until replacement or cleaning of the imaging member 12 is implemented. In one example, a layer of contamination material of approximately 40 nm upon the surface of the imaging member 12 and the presence of humidity in a range of 50-80% relative humidity resulted in degradation of print quality.

The example arrangement of FIG. 3 includes a humidity control system 40 according to one embodiment. Humidity control system 40 is configured to control the humidity in at least one region of the hard imaging device 10 according to one embodiment.

In some embodiments, humidity control system 40 is configured to provide relatively low humidity (e.g., less than 30% relative humidity and within a range of 10%-30% relative humidity in one specific example) in a region adjacent to the surface of the imaging member 12 which may have contamination material formed thereon. The humidity may be controlled by humidity control system 40 during imaging operations including formation of the latent images and development of the latent images in one embodiment.

In one embodiment, different relative humidities are provided in different regions of the hard imaging device 10. For example, it may be desired to provide air of a relatively high humidity (e.g., approximately 50% relative humidity or higher) in a region of the hard imaging device 10 along a media path where media 22 passes to avoid or reduce jams in media handling equipment, such as rollers (the media path and media handling equipment are not shown). The humidity in this region along the media path may be controlled by system 40 to be at a desired amount (e.g., approximately 50% relative humidity) or the humidity may be uncontrolled in example embodiments. Humidity control system 40 may provide relatively low humidity in the region adjacent to the surface of the imaging member 12 as mentioned above in one embodiment. In one more specific example, the humidity control system 40 is configured to provide the relatively low humidity in the region adjacent to the surface of the imaging member 12 which is adjacent to the charging assembly 14.

In another embodiment, the humidify control system 40 provides relatively low humidity (e.g., 10%-30% relative humidity) within a housing (not shown) which houses the components of the image engine 8 shown in FIG. 3. In yet another embodiment, the humidify control system 40 provides relatively low humidity within substantially an entirety of an interior of the hard imaging device 10 during imaging operations.

The example embodiment of humidity control system 40 shown in FIG. 3 includes a cover 42, air supply 44, and heater 46. In other embodiments of humidity control system 40, one or more of the cover 42, air supply 44, or heater 46 may be omitted. Further, additional and/or alternative components configured to reduce or control humidity may be used in other arrangements of system 40.

Cover 42 is provided adjacent to a portion of the surface of imaging member 12 intermediate cleaning system 24 and charging assembly 14 in the illustrated embodiment. In the illustrated example, cover 42 also extends about the charging assembly 14 and a humidity/temperature sensor 48. The cover 42 defines a region of device 10 adjacent to the surface of imaging member 12 and intermediate the surface and cover 42 where relatively low humidity is provided by humidity control system 40. In one embodiment, cover 42 separates this relatively low humidity region from other regions within a housing of the device 10 which may have higher relative humidities.

Air supply 44 is configured to supply dry air 45 having relatively low humidity into the region defined by the cover 42 and the surface of the imaging member 12. In some embodiments, one or more condenser and/or dehumidifier (not shown in FIG. 3) may be coupled with air supply 44 and may be utilized to provide the dry air 45 into the region of relatively low humidity. For example, in one embodiment, air supply 44 may be coupled with at least a portion of an outlet 60 of an air supply system 50 (e.g., FIG. 4). In some embodiments, the dry air 45 may be compressed dry air with approximately 0% relative humidity.

In some arrangements, cleaning system 24 includes a blade (not labeled in FIG. 3) which is configured to engage the outer surface of imaging member 12 to implement cleaning operations. As shown in the illustrated example, the rotation of imaging member 12 in the counter-clockwise direction moves the surface of the imaging member 12 from the cleaning system 24 into the region defined by the cover 42 in one embodiment. The blade of the cleaning system 24 and movement of the imaging member 12 may operate to lower the humidity within the region defined by the cover 42 without the use of air supply 44 in some configurations, and accordingly, air supply 44 may be omitted in some embodiments as mentioned above.

Humidity control system 40 may additionally include a heater 46 configured to provide an appropriate temperature to imaging member 12 to reduce condensation of humidity on the surface of the imaging member 12 in one embodiment. In one example, heater 46 heats the surface of the imaging member 12 which reduces the condensation of humidity upon the surface of imaging member 12 compared with other arrangements where the imaging member 12 is not heated. In some embodiments, the temperature of the imaging member 12 may be raised to approximately 30 degrees Celsius to provide reduced condensation. The heater 46 may be provided within a region defined by cover 42 and the surface of imaging member 12 in one embodiment.

The example embodiment of humidity control system 40 of FIG. 3 may additionally include a temperature/humidity sensor 48 configured to monitor temperature and relative humidity adjacent to the surface of the imaging member 12. In one embodiment, processing circuitry 32 may monitor the relative humidity and temperature via sensor 48 and adjust one or more operation of the device 10 to provide a desired humidity or temperature. For example, if humidity is high, the processing circuitry 32 may increase a flow of dry air 45 via supply 44. Additionally, if the temperature of imaging member 12 is less than desired, the processing circuitry 32 may increase the output of heater 46 to increase the temperature of the surface of the imaging member 12.

As discussed above, humidity control system 40 may include other components and/or implement other methods to provide a desired humidity in other embodiments.

Figure 4:
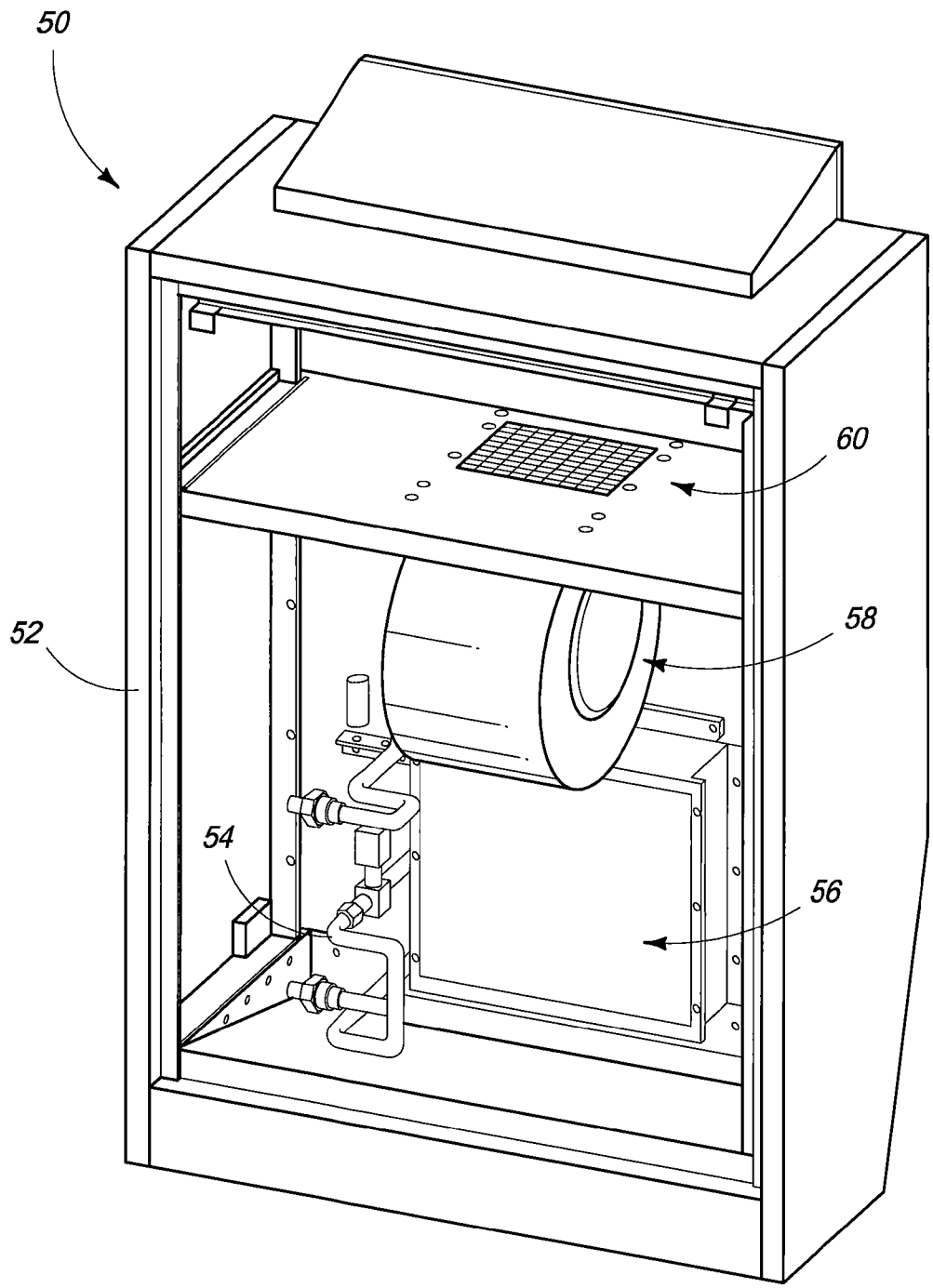
FIG. 4 is an illustrative representation of an air supply system according to one embodiment.

Referring to FIG. 4, one embodiment of an air supply system 50 is shown. The air supply system 50 may be configured to supply air to air supply 44 of FIG. 3 for supply to the region defined by cover 42 and the surface of imaging member 12 in one embodiment. In other embodiments, the air may be supplied to additional regions within the hard imaging device 10 or to substantially the entirety of the hard imaging device 10.

Air may be drawn from the interior of a housing 52 of the hard imaging device 10 into air supply system 50 via a condensation device 56 according to one embodiment. The condensation device 56 may include a heat exchanger, for example in the form of a coil (not shown) containing a low temperature fluid, such as water at 9 degrees Celsius, from a cooling water supply 54 in one embodiment. A refrigerant based air cooler is used in condensation device 56 to provide efficient cooling and dehumidification of the air in the presently described example. The condensation device 56 causes water vapor and perhaps other vapors (e.g., oil vapors from the liquid marking agent) to condense into liquid states which may be removed from the air.

A blower 58 draws the air which was dried within the condensation device 56 and provides the dry air via an outlet 60 to appropriate region(s) of the hard imaging device 10. For example, the blower 58 may direct the air to an inlet of air supply 44 to direct the air to the region defined by the cover 42 and the surface of the imaging member 12 in one embodiment. Alternatively, the blower 58 may direct the air to substantially all of the interior regions the hard imaging device 10 in another embodiment.

Figure 5:
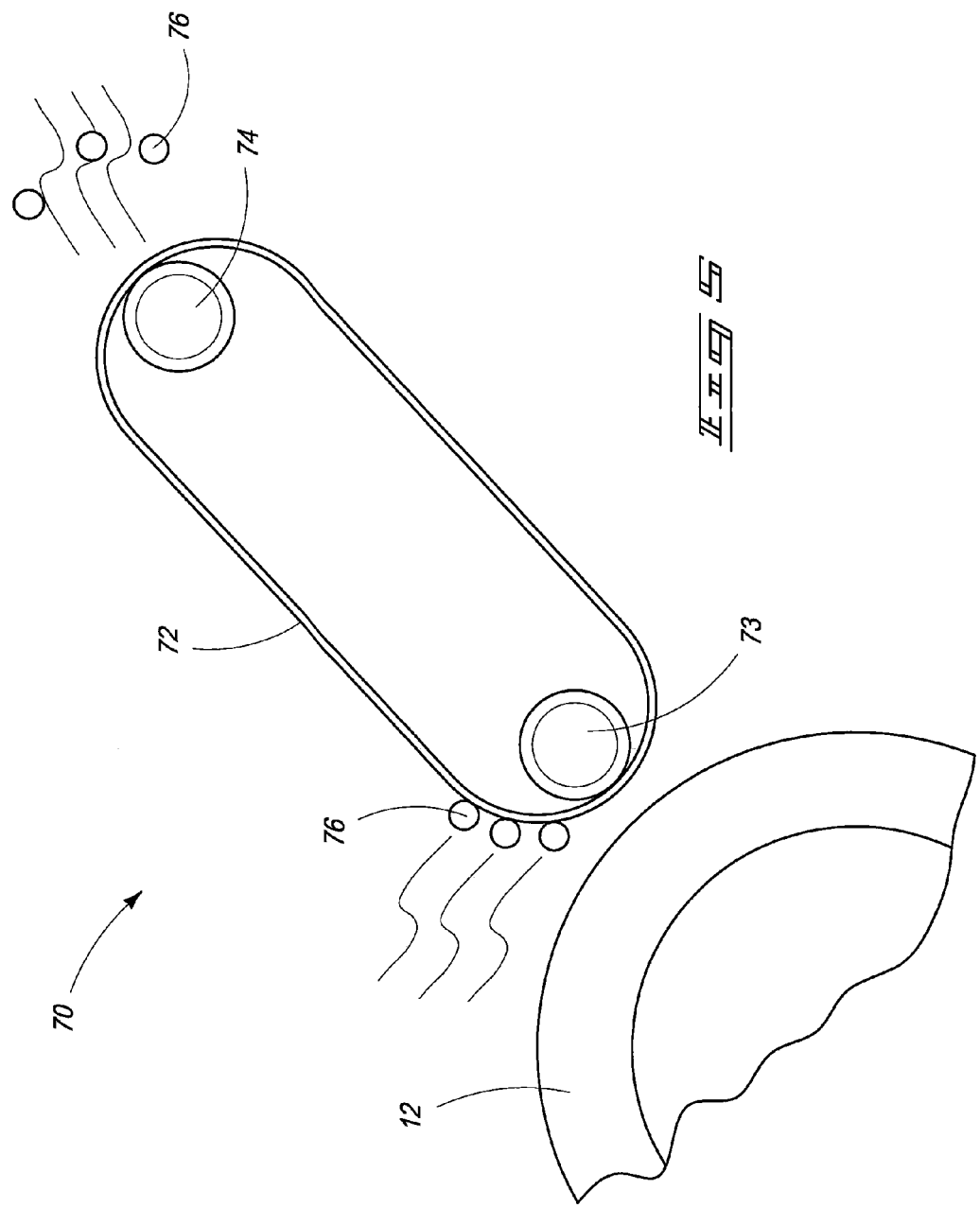
FIG. 5 is an isometric view of a dehumidifier according to one embodiment.

Referring to FIG. 5, one embodiment of a dehumidifier 70 is shown. The illustrated dehumidifier 70 is implemented as a desiccant-based dehumidifier including a belt 72 and a plurality of rollers 73, 74. In one embodiment, the roller 73 may be provided in a region of hard imaging device 10 where relatively low relative humid air is desired and the roller 74 may be provided in a different location, for example, external of the housing of hard imaging device 10. Desiccant is provided in the rotating belt 72 in the depicted embodiment and the desiccant absorbs water molecules 76 from the relatively low relative humid region. The belt 72 is rotated to provide the desiccant containing the absorbed water molecules to a position adjacent to the roller 74 where the desiccant may be heated to cause emission of the water molecules from the belt 72 in one embodiment. For example, the water may be emitted externally of a housing of the hard imaging device 10 in one embodiment. Regenerated desiccant may again be rotated to a position adjacent to the roller 73 to cool and absorb additional water molecules and the process may be repeated to provide the relatively low relative humid air.

In one implementation, the roller 73 may be provided adjacent to the surface of the imaging member 12 to provide the relatively low humidity region adjacent to the surface of the imaging member 12 as shown. In one example, cover 42 and air supply 44 may be omitted and the roller 73 may be positioned adjacent to the surface of imaging member 12 between charging assembly 14 and cleaning system 24. In another embodiment, the roller 73 may be configured to reduce humidity of air 45 supplied via air supply 44 to the surface of the imaging member 12. In other possible embodiments, the roller 73 may be positioned within the housing of the hard imaging device 10 to reduce humidity within the housing containing the image engine 8 or substantially an entirety of the hard imaging device 10. Other configurations of dehumidifier 70 and hard imaging device 10 are possible in other embodiments.

As described according to some of the embodiments of the disclosure, an imaging member 12 having a certain amount of contamination may be used to provide suitable print quality. In one example, it is desired to provide the surface of the imaging member 12 having a surface resistance of greater than approximately $1.4 \times 10^{15}$ Ohms/Square to provide acceptable print quality. Some of the disclosed embodiments provide improved print quality by providing relatively low humidity within at least one region of the hard imaging device which reduces the lateral conductivity of the surface of imaging member 12 even in the presence of contamination material upon the surface of the imaging member (i.e., reduced lateral conductivity compared with arrangements which do not control the humidity). A threshold of maximum acceptable lateral conductivity is approximately 180 pmho/cm for a 40 nm layer of contamination in one embodiment. The threshold of maximum acceptable lateral conductivity is inversely proportional to the thickness of the contamination layer upon the surface of the imaging member and accordingly may vary depending upon the amount of contamination.

Accordingly, some embodiments of the disclosure provide printing at less cost per page since the life of the imaging member may be extended even in the presence of contamination by reducing the lateral conductivity upon the surface of the imaging member by providing one or more regions of relatively low humidify in the hard imaging device.

At least some of the disclosed embodiments alleviate drawbacks of some conventional arrangements which may polish, abrade or otherwise physically clean the surface of the imaging member 12 to remove the contamination material formed during printing. Some drawbacks of these systems include consumption of space about the imaging member to account for the cleaning system (reducing the space available for other imaging structures, such as additional developer units for additional colors) and contamination caused by the removal of the contamination material. In a more specific example, polishing may introduce micron-size polycarbonate debris into the image engine, which may be caught by the cleaning blade of the cleaning system and cause print defects. Furthermore, polishing of the imaging member may also increase the roughness of the surface of the imaging member and enhance appearance of blade defects. Additionally, arrangements which implement physical cleaning to remove the contamination material may have increased costs per page to account for the cleaning apparatus as well as the polishing pads which are consumed during imaging operations.

In one example, a region adjacent to the surface was maintained at approximately 15% relative humidity and compared with operations where the humidity was not controlled (e.g., approximately 50% relative humidity). It was observed that streaks in printed output caused by contamination and increased lateral conductivity occurred after approximately 80 k impressions in the relatively low humidity environment compared with approximately 40 k impressions when the humidity was not controlled. In one example, degradation of print quality resulting from contamination material occurred after approximately 2 k impressions when relative humidity was approximately 80%. Accordingly, at least one embodiment of the disclosure utilizing relatively low humidity has utility by enabling additional impressions to be imaged (e.g., 80 k) with reduced presence of streaky print defects compared with arrangements where humidity is not controlled (e.g., streaky defects occurring after 40 k impressions).

The protection sought is not to be limited to the disclosed embodiments, which are given by way of example only, but instead is to be limited only by the scope of the appended claims.

Further, aspects herein have been presented for guidance in construction and/or operation of illustrative embodiments of the disclosure. Applicant(s) hereof consider these described illustrative embodiments to also include, disclose and describe further inventive aspects in addition to those explicitly disclosed. For example, the additional inventive aspects may include less, more and/or alternative features than those described in the illustrative embodiments. In more specific examples, Applicants consider the disclosure to include, disclose and describe methods which include less, more and/or alternative steps than those methods explicitly disclosed as well as apparatus which includes less, more and/or alternative structure than the explicitly disclosed structure.

The invention claimed is:

1. A hard imaging device comprising:
an imaging member comprising a surface;
a writing assembly configured to form latent images upon the surface of the imaging member;
a development assembly configured to provide a marking agent to the surface of the imaging member to develop the latent images to form developed images;
a transfer assembly configured to transfer the developed images from the surface of the imaging member to media to form a plurality of hard images; and
a humidity control system configured to control humidity within a region of the hard imaging device which is adjacent to the surface of the imaging member to provide the surface of the imaging member with an acceptable lateral conductivity which maintains a suitable print quality as a thickness of a contamination layer upon the surface of the imaging member increases up to a certain contamination layer thickness during the forming and the development of the latent images.

2. The hard imaging device of claim 1 wherein the humidity control system is configured to control the humidity within the region of the hard imaging device which is different than humidity within another region of the hard imaging device.

3. The hard imaging device of claim 1 wherein the humidity control system is configured to control the humidity within the region of the hard imaging device which is adjacent to only a portion of the surface of the imaging member.

4. The hard imaging device of claim 3 wherein the humidity control system comprises a cover adjacent to only the portion of the surface of the imaging member.

5. The hard imaging device of claim 3 wherein the humidity control system is configured to control the humidity within the region of the hard imaging device which is adjacent to a charging system which is upstream of the writing assembly and which is configured to provide a blanket electrical charge to substantially an entirety of the surface of the imaging device.

6. The hard imaging device of claim 1 wherein the humidity control system is configured to control the humidity within the region to be less than approximately 30% relative humidity.

7. The hard imaging device of claim 1 wherein the humidity control system is configured to control the humidity within the region of the hard imaging device to provide the surface of the imaging member having reduced lateral conductivity compared with the lateral conductivity of the surface of the imaging member where the humidity within the region of the hard imaging device is not controlled by the humidity control system.

8. The hard imaging device of claim 7 wherein the humidity control system is configured to control the humidity within substantially an entirety of an interior of the hard imaging device and which includes the region.

9. The hard imaging device of claim 1 wherein the humidity control system is configured to control the humidity within the region of the hard imaging device to be less than humidity within another region within the hard imaging device.

10. The hard imaging device of claim 1 wherein the imaging member comprises an organic photoconductor and the development assembly is configured to provide the marking agent comprising a liquid marking agent to the surface of the imaging member.

11. A hard imaging device humidity control system configured to control humidity within a region of a hard imaging device which is adjacent to a surface of a photoconductive member of the hard imaging device to provide the surface of the photoconductive member having reduced lateral conductivity compared with the lateral conductivity of the surface of the photoconductive member where the humidity within the region of the hard imaging device is not controlled by the humidity control system, wherein the reduced lateral conductively provides an acceptable lateral conductivity which maintains a suitable print quality as a thickness of a contamination layer upon the surface of the photoconductive member increases up to a certain contamination layer thickness.

12. A hard imaging method comprising:
   forming latent images upon a surface of an imaging member of a hard imaging device;
   developing the latent images upon the surface of the imaging member using a marking agent to form a plurality of developed images corresponding to the latent images;
   transferring the developed images from the surface of the imaging member to media to form a plurality of hard images; and
   controlling humidity within a region of the hard imaging device which is adjacent to the surface of the imaging member to provide the surface of the imaging member with an acceptable lateral conductivity which maintains a suitable print quality as a thickness of a contamination layer upon the surface of the imaging member increases up to a certain contamination layer thickness during the forming and the developing.

13. The method of claim 12 wherein the controlling comprises controlling the humidity within the region of the hard imaging device to provide the surface of the imaging member having reduced lateral conductivity compared with the lateral conductivity of the surface of the imaging member in the absence of the controlling of the humidity within the region of the hard imaging device.

14. The method of claim 12 further comprising charging substantially an entirety of the surface of the imaging member at a location of the surface of the imaging member, and the controlling the humidity within the region comprises only controlling the humidity within the region of the hard imaging device which is adjacent to the location of the charging.

15. The method of claim 12 wherein the controlling comprises controlling the humidity within the region of the hard imaging device to be less than humidity within another region within the hard imaging device.

* * * * *